(12) United States Patent
Umeda et al.

(10) Patent No.: US 11,029,449 B2
(45) Date of Patent: Jun. 8, 2021

(54) ANTIREFLECTION FILM, OPTICAL ELEMENT, OPTICAL SYSTEM, METHOD OF PRODUCING ANTIREFLECTION FILM

(71) Applicant: FUJIFILM Corporation, Tokyo (JP)

(72) Inventors: Kenichi Umeda, Kanagawa (JP); Seigo Nakamura, Kanagawa (JP); Yuichiro Itai, Kanagawa (JP); Hideki Yasuda, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 184 days.

(21) Appl. No.: 16/269,271

(22) Filed: Feb. 6, 2019

(65) Prior Publication Data

US 2019/0170908 A1    Jun. 6, 2019

Related U.S. Application Data

(63) Continuation of application No. PCT/JP2017/031034, filed on Aug. 29, 2017.

(30) Foreign Application Priority Data

Aug. 31, 2016   (JP) .............................. JP2016-168900

(51) Int. Cl.
*G02B 1/115* (2015.01)
*G02B 15/20* (2006.01)
(Continued)

(52) U.S. Cl.
CPC ............... *G02B 1/115* (2013.01); *B32B 9/00* (2013.01); *B32B 15/04* (2013.01); *C23C 14/06* (2013.01); *G02B 15/145* (2019.08); *G02B 15/20* (2013.01)

(58) Field of Classification Search
CPC ...... G02B 1/115; G02B 15/20; G02B 15/173; G02B 1/111; G02B 15/167; G02B 1/116;
(Continued)

(56) References Cited

U.S. PATENT DOCUMENTS 5,521,765 A * 5/1996 Wolfe .................... G02B 1/116
                                                       359/885
2013/0308192 A1   11/2013 Shimoda
2014/0170422 A1*  6/2014 Wang .................. C03C 17/3644
                                                       428/432

FOREIGN PATENT DOCUMENTS

JP          8-54507 A      2/1996
JP          9-323374 A    12/1997
(Continued)

OTHER PUBLICATIONS

Translation of JPH09323374A (Year: 1997).*
(Continued)

*Primary Examiner* — Darryl J Collins
*Assistant Examiner* — Matthew Y Lee
(74) *Attorney, Agent, or Firm* — Birch, Stewart, Kolasch & Birch, LLP

(57) ABSTRACT

An antireflection film is formed by laminating an interlayer, a silver-containing metal layer containing silver, and a dielectric layer in this order from the substrate, an anchor region including an oxide of an anchor metal is provided between the silver-containing metal layer and the interlayer, a cap region including an oxide of the anchor metal included in the anchor region is provided between the silver-containing metal layer and the dielectric layer, a crystal grain size obtained by X-ray diffraction measurement in the silver-containing metal layer is less than 6.8 nm, and the anchor metal has a surface energy less than a surface energy of silver and greater than a surface energy of a layer of the interlayer closest to the silver-containing metal layer.

5 Claims, 10 Drawing Sheets

(51) Int. Cl.
    *C23C 14/06*     (2006.01)
    *B32B 15/04*     (2006.01)
    *B32B 9/00*     (2006.01)
    *G02B 15/14*     (2006.01)

(58) Field of Classification Search
    CPC .. G02B 1/10; G02B 1/11; C23C 14/06; C23C 14/5893; C23C 14/024; C23C 14/14; B32B 15/04; B32B 9/00
    See application file for complete search history.

(56) References Cited

FOREIGN PATENT DOCUMENTS

| | | | | |
|---|---|---|---|---|
| JP | H09323374 A | * | 12/1997 | ............ C03C 17/36 |
| JP | 2001-324601 A | | 11/2001 | |
| JP | 2003-255105 A | | 9/2003 | |
| JP | 2004-334012 A | | 11/2004 | |
| JP | 2006-184849 A | | 7/2006 | |
| JP | 2013-238709 A | | 11/2013 | |
| KR | 20160123671 | * | 10/2016 | ............... G02B 1/11 |

OTHER PUBLICATIONS

Translation of KR20160123671A (Year: 2016).*
Japanese Office Action for Japanese Application No. 2018-537315, dated Jan. 21, 2020, with English translation.
International Preliminary Report on Patentability (form PCT/IPEA/409) with a completion date of Nov. 27, 2018, for corresponding International Application No. PCT/JP2017/031034, along with an English translation, dated Dec. 11, 2018.
International Search Report (form PCT/ISA/210), dated Nov. 21, 2017, for corresponding International Application No. PCT/JP2017/031034, with an English translation.
Written Opinion of the International Preliminary Examination Authority (form PCT/IPEA/408), dated Jul. 31, 2018, for corresponding International Application No. PCT/JP2017/031034.
Written Opinion of the International Searching Authority (forms PCT/ISA/237), dated Nov. 21, 2017, for corresponding International Application No. PCT/JP2017/031034, with an English translation.

* cited by examiner

Ag

ANC

ANTIREFLECTION FILM, OPTICAL ELEMENT, OPTICAL SYSTEM, METHOD OF PRODUCING ANTIREFLECTION FILM

CROSS-REFERENCE TO RELATED APPLICATIONS

This application is a continuation application of International Application No. PCT/JP2017/031034, filed Aug. 29, 2017, the disclosure of which is incorporated herein by reference in its entirety. Further, this application claims priority from Japanese Patent Application No. 2016-168900, filed Aug. 31, 2016, the disclosure of which is incorporated herein by reference in its entirety.

BACKGROUND OF THE INVENTION

1. Field of the Invention

The present invention relates to an antireflection film, an optical element including an antireflection film, and an optical system including the optical element.

2. Description of the Related Art

In the related art, in a lens (transparent substrate) formed of a light transmitting member such as glass or a plastic, an antireflection film is provided on a light incident surface in order to reduce the loss of transmitted light caused by surface reflection.

As an antireflection film that exhibits a very low reflectance with respect to visible light, configurations of a fine uneven structure having a pitch shorter than the wavelength of visible light and a porous structure obtained by forming a large number of pores on the uppermost layer thereof are known. In a case of using an antireflection film having a structure layer of a fine uneven structure, a porous structure, or the like on the uppermost layer as a layer of low refractive index, an ultra-low reflectance of 0.2% or less can be obtained in a wide wavelength range of a visible light region. However, since these films have a fine structure on the surface thereof, there are defects that the film has low mechanical strength and is very weak to an external force such as wiping. Therefore, portions such as outermost surfaces (first lens front surface and final lens back surface) of a group lens used for a camera lens or the like, which are touched by a user, cannot be subjected to ultra-low reflectance coating having a structure layer.

On the other hand, as an antireflection film not including a structure layer on the surface thereof, an antireflection film including a metal layer containing silver (Ag) in a laminate of dielectric films is disclosed in JP2006-184849A, JP1996-054507A (JP-H08-054507A), JP2003-255105A, and the like.

JP2006-184849A discloses an antireflection laminate having a conductive antireflection layer obtained by alternately providing a high refractive index transparent thin film layer and a metal thin film layer on a transparent substrate, and a low refractive index transparent thin film layer in contact with the high refractive index transparent thin film layer on the outermost layer thereof. In addition, JP2006-184849A discloses that as a layer for protection from corrosion, a protective layer may be provided for upper and lower layers of the metal thin film layer. For the protective layer, metals such as zinc, silicon, nickel, chromium, gold, and platinum, alloys thereof, and oxides, fluorides, sulfides and nitrides of these metals may be used.

JP1996-054507A (JP-H08-054507A) discloses an antireflection film including a thin metal layer that is interposed between a front coating layer and a back coating layer and is protected from scratches by a protective silicon nitride layer. For the coating layers, nickel, chromium, rhodium, platinum, tungsten, molybdenum, tantalum, an alloy of nickel and chromium, and the like may be used.

JP2003-255105A discloses an antireflection film that is formed by laminating a metal thin film layer and a metal oxide thin film layer on a substrate, in which an underlayer is provided between the substrate and the metal thin film layer in order to stabilize the metal thin film layer, and an interlayer is provided between the metal thin film layer and the metal oxide thin film layer. As the underlayer and the interlayer, metal thin film layers of silicon, titanium, and the like may be used.

SUMMARY OF THE INVENTION

However, in a case where a metal layer is provided as a protective layer or a coating layer on the upper and lower layers of the metal thin film as disclosed in JP2006-184849A, JP1996-054507A (JP-H08-054507A), and JP2003-255105A, there is a problem that transparency is lowered due to coloration with a metal. Further, in a case where an oxide or a nitride is provided as disclosed in JP2006-184849A, the surface energy is small, and thus, in a case where an extremely thin metal thin film layer is formed thereon, aggregation of the metal occurs so that the metal is granulated. Thus, it is difficult to form a flat film. Therefore, it is not possible to achieve both high transparency and high flatness, and antireflection performance may be lowered.

The present invention is made in consideration of the above circumstances, and an object thereof is to provide an antireflection film having high mechanical strength, high light transmittance, and high antireflection performance, an optical element including the antireflection film, and an optical system including the optical element.

According to the present invention, there is provided an antireflection film that is provided on a substrate, and is formed by laminating an interlayer, a silver-containing metal layer containing silver, and a dielectric layer in this order from the substrate, comprising:

an anchor region including an oxide of an anchor metal provided between the silver-containing metal layer and the interlayer; and a cap region including an oxide of the anchor metal provided between the silver-containing metal layer and the dielectric layer, in which a crystal grain size obtained by X-ray diffraction measurement in the silver-containing metal layer is less than 6.8 nm, and the anchor metal has a surface energy less than a surface energy of silver and greater than a surface energy of a layer of the interlayer closest to the silver-containing metal layer.

Here, the expression "containing silver" indicates that the content of silver included in the silver-containing metal layer is 50 atomic % or more.

Here, the expression "crystal grain size obtained by X-ray diffraction measurement" refers to a value obtained by acquiring an X-ray diffraction chart by grazing incidence X-ray diffraction (GIXRD) which is measurement for a thin film with the incidence angle fixed near the critical angle, and calculating the value from a half-width of a (111) plane peak of silver observed near a diffraction angle $2\theta=38°$ in the X-ray diffraction chart using the Scherrer equation.

In the antireflection film of the present invention, it is preferable that a total film thickness including the anchor region, the silver-containing metal layer, and the cap region is 10 nm or less.

In the antireflection film of the present invention, it is preferable that in a case where the anchor region includes the anchor metal which is not oxidized, a content ratio of the oxide of the anchor metal is larger than a content ratio of the anchor metal which is not oxidized.

In the antireflection film of the present invention, it is preferable that the anchor metal is Ge, Sn, In, Ga, or Zn.

In the antireflection film of the present invention, the surface energy of the anchor metal is preferably 350 mN/m or more and 1000 mN/m or less and more preferably 500 mN/m or more and 900 mN/m or less.

According to the present invention, there is provided an optical element comprising the antireflection film according to the present invention.

According to the present invention, there is provided an optical system comprising: a group lens in which the antireflection film of the optical element according to the present invention is arranged on outermost surfaces thereof.

Here, the expression "outermost surfaces" refers to one side surfaces of lenses arranged at both ends of the group lens consisting of a plurality of lenses and refer to surfaces which become both end surfaces of the group lens.

The antireflection film according to the present invention is formed by laminating an interlayer, a silver-containing metal layer containing silver, and a dielectric layer on a substrate in this order, in which an anchor region including an oxide of an anchor metal is provided between the silver-containing metal layer and the interlayer, a cap region including an oxide of the anchor metal included in the anchor region is provided between the silver-containing metal layer and the dielectric layer, a crystal grain size obtained by X-ray diffraction measurement in the silver-containing metal layer is less than 6.8 nm, and the anchor metal has a surface energy less than a surface energy of silver and greater than a surface energy of a layer of the interlayer closest to the silver-containing metal layer. In the configuration, the silver-containing metal layer has very high smoothness, and thus it is possible to obtain a configuration having high antireflection performance due to an antireflection structure in which the interlayer and the dielectric layer are combined with the silver-containing metal layer having high smoothness. Since the anchor region and the cap region include an oxide of the anchor metal, high transparency is obtained compared to a case where an anchor layer formed of a metal is provided.

Since the antireflection film according to the present invention does not have an uneven structure or a porous structure, the antireflection film has high mechanical strength and is applicable to a surface of an optical member which is touched by a hand of a user.

DESCRIPTION OF THE PREFERRED EMBODIMENTS

Hereinafter, embodiments of the present invention will be described.

Figure 1:
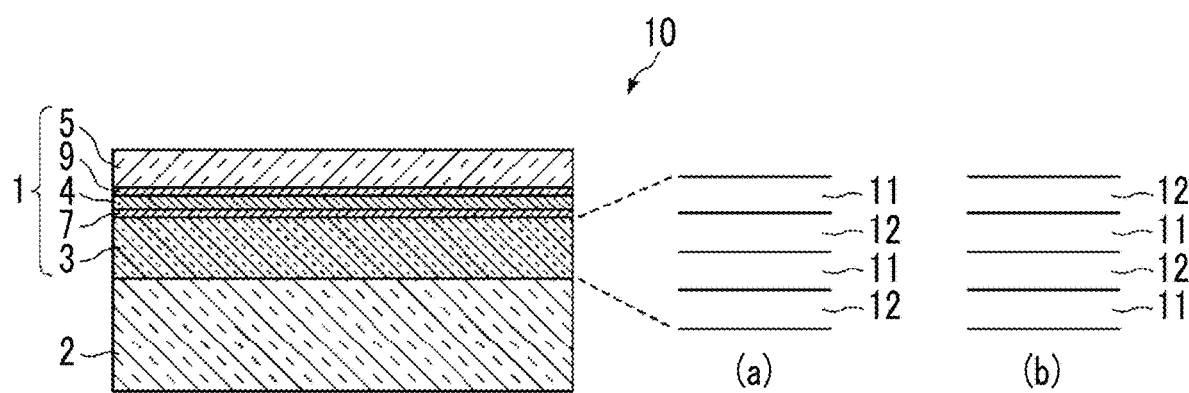
FIG. 1 is a schematic cross-sectional view showing a schematic configuration of an optical element including an antireflection film according to an embodiment of the present invention.

FIG. 1 is a schematic cross-sectional view showing a schematic configuration of an optical element 10 including an antireflection film 1 according to a first embodiment of the present invention. As shown in FIG. 1, the antireflection film 1 of the embodiment is formed by laminating an interlayer 3, a silver-containing metal layer 4 containing silver (Ag), and a dielectric layer 5 on a substrate 2 in this order. In the antireflection film 1, an anchor region 7 including an oxide of an anchor metal is provided between the silver-containing metal layer 4 and the interlayer 3, a crystal grain size obtained by X-ray diffraction measurement in the silver-containing metal layer is less than 6.8 nm, and a cap region 9 including an oxide of the anchor metal is provided between the silver-containing metal layer 4 and the dielectric layer 5. Here, the anchor metal has a surface energy less than a surface energy of silver and greater than a surface energy of a layer of the interlayer 3 closest to the silver-containing metal layer 4.

In the antireflection film 1 according to the embodiment of the present invention, light to be reflected varies depending on the purpose and is generally light in a visible light region. As required, light in an infrared region may be used.

The shape of the substrate 2 is not particularly limited and the substrate is a transparent optical member (transparent substrate) that is mainly used in an optical device such as a flat plate, a concave lens, or a convex lens and also may be a substrate constituted by a combination of a curved surface having a positive or negative curvature and a flat surface. As the material for the substrate 2, glass, plastic, and the like can be used. Here, the term "transparent" means being transparent (having an internal transmittance of about 10% or more) to a wavelength of light of which reflection is to be suppressed (reflection prevention target light) in the optical member.

The refractive index of the substrate 2 is not particularly limited and is preferably 1.45 or more. The refractive index of the substrate 2 may be 1.61 or more and 1.74 or more and further 1.84 or more. For example, the substrate 2 may be a high power lens such as a first lens of a group lens of a camera or the like. In the present specification, the refractive index indicates a refractive index with respect to light having a wavelength of 500 nm.

The interlayer 3 may be a single layer or may be formed of a plurality of layers. In a case where the interlayer is a single layer, the interlayer may have a refractive index different from the refractive index of the substrate 2 and in a case where the interlayer is formed of a plurality of layers, the interlayer is preferably formed by alternately laminating a layer 11 of high refractive index and a layer 12 of low refractive index. In this case, as shown in (a) of FIG. 1, the layer 12 of low refractive index and the layer 11 of high refractive index may be laminated in this order from the substrate 2. As shown in (b) of FIG. 1, the layer 11 of high refractive index and the layer 12 of low refractive index may be laminated in this order from the substrate 2. In addition, the number of layers of the interlayer 3 is not limited, but is preferably set to 16 layers or less from the viewpoint of suppressing costs. The layer of the interlayer 3 closest to the silver-containing metal layer 4 means, in a case where the interlayer 3 is a single layer, the layer itself.

The refractive index of the layer 11 of high refractive index may be higher than the refractive index of the layer 12 of low refractive index, and the refractive index of the layer 12 of low refractive index may be lower than the refractive index of the layer 11 of high refractive index. It is more preferable that the refractive index of the layer 11 of high refractive index is higher than the refractive index of the substrate 2 and the refractive index of the layer 12 of low refractive index is lower than the refractive index of the substrate 2.

The layers 11 of high refractive index, or the layers 12 of low refractive index may not have the same refractive index. However, it is preferable that the layers are formed of the same material and have the same refractive index from the viewpoint of suppressing material costs, film formation costs, and the like.

Examples of the material for forming the layer 12 of low refractive index include silicon oxide ($SiO_2$), silicon oxynitride (SiON), gallium oxide ($Ga_2O_3$), aluminum oxide ($Al_2O_3$), lanthanum oxide ($La_2O_3$), lanthanum fluoride ($LaF_3$), magnesium fluoride ($MgF_2$), and sodium aluminum fluoride ($Na_3AlF_6$).

Examples of the material for forming the layer 11 of high refractive index include niobium pentoxide ($Nb_2O_5$), titanium oxide ($TiO_2$), zirconium oxide ($ZrO_2$), tantalum pentoxide ($Ta_2O_5$), silicon oxynitride (SiON), silicon nitride ($Si_3N_4$), and silicon niobium oxide (SiNbO).

The refractive index can be changed to some extent by controlling any of these compounds to have the constitutional element ratio which is shifted from the compositional ratio of the stoichiometric ratio or by forming a film by controlling the film formation density. The materials constituting the low refractive index and the high refractive index layer are not limited to the above compounds as long as the above refractive index conditions are satisfied. Further, unavoidable impurities may be included.

Each layer of the interlayer 3 is preferably formed by using a vapor phase film formation method such as vacuum deposition, plasma sputtering, electron cyclotron sputtering, or ion plating. According to the vapor phase film formation method, a laminated structure having various refractive indexes and layer thicknesses can be easily formed.

The silver-containing metal layer 4 is a layer formed of 50 atomic % or more of silver with respect to the constitutional elements. The layer may contain at least one of palladium (Pd), copper (Cu), gold (Au), neodymium (Nd), samarium (Sm), bismuth (Bi), platinum (Pt), tin (Sn), aluminum (Al), zinc (Zn), magnesium (Mg), indium (In), gallium (Ga), or lead (Pb), in addition to silver. Specifically, for example, as the material constituting the silver-containing metal layer 4, an Ag—Nd—Cu alloy, an Ag—Pd—Cu alloy, an Ag—Bi—Nd alloy, or the like may be suitably used. Since the silver-containing metal layer 4 is formed as a very thin layer whose design film thickness is preferably 6 nm or less, atom migration occurs between the layers arranged above and below and the composition at formation and the actual composition are different.

As the raw material for forming the silver-containing metal layer 4, a material in which 85 atomic % or more of the constitutional elements is silver is preferably used. In this case, the content of metal elements other than silver may be less than 15 atomic %, but is more preferably 5 atomic % or less and even more preferably 2 atomic % or less. In this case, the content refers to a total content of two or more metal elements in a case in which the metal layer contains two or more metal elements other than silver. From the viewpoint of preventing reflection, it is most preferable to use pure silver. On the other hand, from the viewpoint of flatness and durability of the silver-containing metal layer, the silver-containing metal layer preferably contains metal elements other than silver.

The total film thickness of the anchor region 7, the silver-containing metal layer 4, and the cap region 9 in the antireflection film is preferably 10 nm or less and more preferably 0.5 nm or more. Further, the total film thickness is preferably 2.0 nm or more, more preferably 2.5 nm or more, and particularly preferably 3 nm or more. The total film thickness including the anchor region 7, the silver-containing metal layer 4, and cap region 9 in the antireflection film after production is a value obtained by X-ray reflectance measurement. Specifically, the total film thickness is a value obtained by measuring a signal near the critical angle using RIGAKU RINT ULTIMA III (CuKα-ray, 40 kV, 40 mA), extracting a vibration component to be obtained and fitting the vibration component. The film thickness of the silver-containing metal layer 4 itself is preferably 6 nm or less from the result of simulation (Example 7 or the like). Since the silver-containing metal layer 4 is a film which is formed to be very thin, actually, discontinuous regions or missing regions may be formed in some cases.

In addition, the formed film surface is not a perfectly smooth surface and is typically a surface having granular unevenness. This means that as the grain size of crystal grains (crystal grain size) forming the granular unevenness becomes smaller, the smoothness becomes higher. In the present invention, the crystal grain size obtained by X-ray diffraction measurement in the silver-containing metal layer is less than 6.8 nm.

A vapor phase film formation method such as vacuum deposition, plasma sputtering, electron cyclotron sputtering, or ion plating is preferably used to form the silver-containing metal layer 4.

The refractive index of the dielectric layer 5 is preferably 1.35 or more and 1.51 or less. The material for constituting the dielectric layer 5 is not particularly limited. Examples thereof include silicon oxide ($SiO_2$), silicon oxynitride (SiON), magnesium fluoride ($MgF_2$), and sodium aluminum fluoride ($Na_3AlF_6$). Particularly preferable is $SiO_2$ or $MgF_2$. The refractive index can be changed to some extent by controlling any of these compounds to have the constitutional element ratio which is shifted from the compositional ratio of the stoichiometric ratio or by forming a film by controlling the film formation density.

The thickness of the dielectric layer 5 is preferably about λ/4n in a case in which a target wavelength is λ and the refractive index of the dielectric layer is n. Specifically, the thickness of the dielectric layer is about 70 nm to 100 nm.

The anchor region 7 is a region formed by alternation of an anchor layer which is provided to smoothly form the silver-containing metal layer after the interlayer 3 is laminated and before the silver-containing metal layer 4 is laminated, is formed of an anchor metal, and has a thickness of 0.2 nm to 2 nm (refer to the production method described later) in the production process, and is an interface region between the interlayer 3 and the silver-containing metal layer 4. Here, the alternation means that mixing with the constitutional elements of the interlayer and the silver-containing metal layer or oxidation of a metal element or the like occurs and the state of the anchor layer becomes different from the state at the time of formation of the layer.

Similarly, the cap region 9 is an interface region between the silver-containing metal layer 4 and the dielectric layer 5 including such an oxide of the anchor metal obtained in such a manner that the anchor metal constituting the anchor layer is made to pass through the silver-containing metal layer 4 and is oxidized by oxygen under an environment on the surface of the silver-containing metal layer 4 in the production process.

After the anchor layer 6 is altered to the anchor region 7 and the cap region 9, there is a case where the total film thickness of both regions 7 and 9 is increased with the oxidation of the anchor metal by about two times compared to the film thickness of the anchor layer 6.

Accordingly, the atoms present in the silver-containing metal layer 4 and the interlayer 3 are mixed in the anchor region 7 in addition to the anchor metal and the oxide thereof, and the atoms present in the silver-containing metal layer 4 and the dielectric layer 5 are mixed in the cap region 9 in addition to the anchor metal oxide. The anchor region 7 and the cap region 9 are regions in which when the content of the anchor metal is measured in the depth direction (lamination direction), the content is about 1 nm or less around a position showing the peak (the position in the depth direction) in a line profile showing a change in the content at the position in the depth direction (refer to FIG. 9). In the line profile, two peaks are observed. Of the two peaks, one closer to the substrate is the peak of the anchor region and the other far from the substrate is the peak of the cap region. The anchor metal content peak position can be calculated from the line profile of, for example, TEM-EDX: (transmission electron microscope (TEM)-energy dispersive X-ray spectroscopy (EDX)) (example of device: HD-2700, manufactured by Hitachi High-Technologies Corporation). In the line profile, the point where the signal of the anchor metal is strong (maximum value) is calculated as the peak position (for example, refer to FIG. 9 or the like).

The anchor metal has a surface energy that is less than the surface energy of silver and greater than the surface energy of a layer of the interlayer closest to the silver-containing metal layer. In the present specification, the surface energy is defined as a surface energy (surface tension) γ calculated using $\gamma=\gamma_0+(t-t_0)(d\gamma/dt)$ from Metal Data Book, edited by The Japan Institute of Metals, version No. 4, p. 16.

Hereinafter, the surface energies of various metal elements at room temperature calculated by the above method are exemplified.

TABLE 1

| Element | Surface energy γ (mN/m) |
|---------|-------------------------|
| Bi | 395.22 |
| Pb | 507.26 |
| Sn | 558.49 |
| In | 567.844 |
| Mg | 778.1 |
| Nd | 778.91 |
| Zn | 848.98 |
| Ge | 857.34 |
| Si | 1045.05 |
| Ag | 1052.712 |
| Al | 1136.25 |
| Mn | 1333.2 |
| Cu | 1422.54 |
| Au | 1679.76 |
| Pd | 1835.94 |
| Hf | 2032.78 |
| Ga | 718 |
| Ti | 2081.6 |
| Cr | 2292 |
| Ir | 2317.983 |
| Ni | 2321.02 |
| Co | 2592.32 |
| Fe | 2612.39 |
| Ta | 2888 |
| Mo | 3024.6 |
| W | 3472.08 |

According to the above table, the surface energy of silver is 1053 mN/m. In contrast, for the layer of the interlayer closest to the silver-containing metal layer (hereinafter, referred to as the outermost layer of the interlayer), specifically, an oxide, nitride, oxynitride or fluoride of a metal applicable to the layer of low refractive index or the layer of high refractive index may be used and these compounds generally have surface energy smaller than the surface energy of the metal. For example, the surface energies of $SiO_2$, $TiO_2$, and $Ta_2O_5$ are about 200 mN/m, 350 mN/m, and 280 mN/m, respectively.

In a case where an ultrathin film of silver having a large surface energy (thickness: 6 nm or less) is directly formed on an oxide or nitride film having a small surface energy, a case where silver particles are bonded to each other is more stable than a case where the silver is bonded with the oxide or nitride. Thus, grain growth of the silver is promoted and it is difficult to form a smooth ultrathin film. As the present inventors are conducting an investigation to form a smooth ultrathin film, promoting the bonding between the silver and the substrate using the anchor layer is effective for suppressing the growth of crystal grains to obtain a smooth ultrathin film of silver. Initially, although the physical properties required for this anchor layer are not clear, it is found that the surface energy of the anchor layer is an important parameter to obtain a smooth ultrathin film. Specifically, for example, since the surface energy of silver is 5 times or more greater than the surface energy of $SiO_2$ used for the interlayer. Thus, it is found that, in order to reduce a difference between the surface energies, the anchor layer having a surface energy between the surface energy of the outermost layer of the interlayer and the surface energy of silver is introduced so that a smooth ultrathin film of silver can be obtained.

As the anchor metal, among the metal elements exemplified in Table 1, bismuth (Bi), lead (Pb), tin (Sn), indium (In), magnesium (Mg), zinc (Zn), gallium (Ga), germanium (Ge), and silicon (Si) having a surface energy satisfying a range of about more than 200 mN/m and less than 1053 mN/m can be applied.

The surface energy of the anchor metal is preferably 350 mN/m or more and 1000 mN/m or less, and more preferably 500 mN/m or more and 900 mN/m or less. Accordingly, Pb, Sn, In, Mg, Zn, Ga, and Ge are preferable. According to the investigation of the present inventors, from the viewpoint of suppressing an increase in particle size of Ag, In, Ga, and Ge are preferable, and Ge is particularly preferable. The anchor metal may not be a single metal but may include two or more metals.

When the anchor layer is formed, an alloy layer formed of two or more metals may be formed and when the anchor layer is formed, a plurality of layers formed of a single metal may be laminated. In a case where a plurality of layers are laminated, it is preferable that the surface energy of layer close to the outermost layer of the interlayer is small and the layers are laminated so that the surface energy becomes larger in the order of lamination.

On the other hand, there is a concern of lowering of transparency due to the metal constituting such an anchor layer, but it is found that transparency is improved by effectively oxidizing the anchor metal to form a metal oxide.

Although it is described in JP2006-184849A that as the protective layer for protecting the metal thin film from corrosion, a metal oxide may be provided for the upper and lower layers of the metal thin film, in a case where the underlayer when the silver-containing metal layer is formed is an oxide layer, as already described above, a homogeneous metal ultrathin film cannot be formed. On the other hand, in a method of producing the antireflection film according to the present invention, the anchor layer formed of the anchor metal is not oxidized and the silver-containing metal layer is formed on the anchor layer. Thus, it is possible to sufficiently secure flatness. Since the anchor layer is oxidized after sufficient flatness and adhesiveness are secured, a metal ultrathin film achieving both high flatness and high transparency can be formed.

There is a case where an oxidized anchor metal (anchor metal oxide) and an unoxidized anchor metal are mixed in the anchor region. However, it is desirable that the content of the anchor metal oxide is larger than the content of the unoxidized anchor metal, and it is particularly preferable that the anchor metal included in the anchor region is fully oxidized. The magnitude relationship between the content of the oxide of the anchor metal and the content of the unoxidized anchor metal in the anchor region can be confirmed based on the signal intensity ratio in measurement by X-ray photoelectron spectroscopy (XPS).

On the other hand, it is preferable that the anchor metal included in the cap region is fully oxidized to form an anchor metal oxide.

The cap region is considered to have an effect of preventing silver from aggregating and growing into a granular form at the time of annealing. In the production process, in a stage in which the anchor layer and the silver-containing metal layer are sequentially formed, the anchor metal starts to move to the cap region and in this state, oxidation of the anchor metal moved to the surface occurs by exposure to the ambient air.

It is considered that the anchor metal becomes stable by becoming an oxide, and cap performance such as silver migration suppression, aggregation suppression, long-term stability, water resistance and moisture resistance is improved. The most part of the anchor metal of the cap region is oxidized by annealing in the presence of oxygen. At this time, it is preferable that 80% or more of the anchor metal included in the cap region is oxidized and it is more preferable that all of the anchor metal in the cap region is oxidized to form an anchor metal oxide. For example, in a case where the anchor metal is Ge, it is preferable to satisfy Ge/O≤1/1.8 and it is particularly preferable to satisfy Ge/O=1/2.

By providing the anchor region and the cap region as described above, an ultrathin silver film structure achieving both high flatness and high transparency can be realized. The antireflection film according to the embodiment of the present invention may include other layers such as a protective layer having a function of protection for suppressing oxidation of the silver-containing metal layer, in addition to the above-described respective layers. In addition, in the film formation of each layer constituting the antireflection film according to the embodiment of the present invention, in a case where an ultrathin layer of nm order is formed, it is difficult to form a uniform film, and in reality, an uneven film is formed or parts (sea) not partially formed into a sea-island state are formed. However, the present invention includes such forms.

Figure 2:
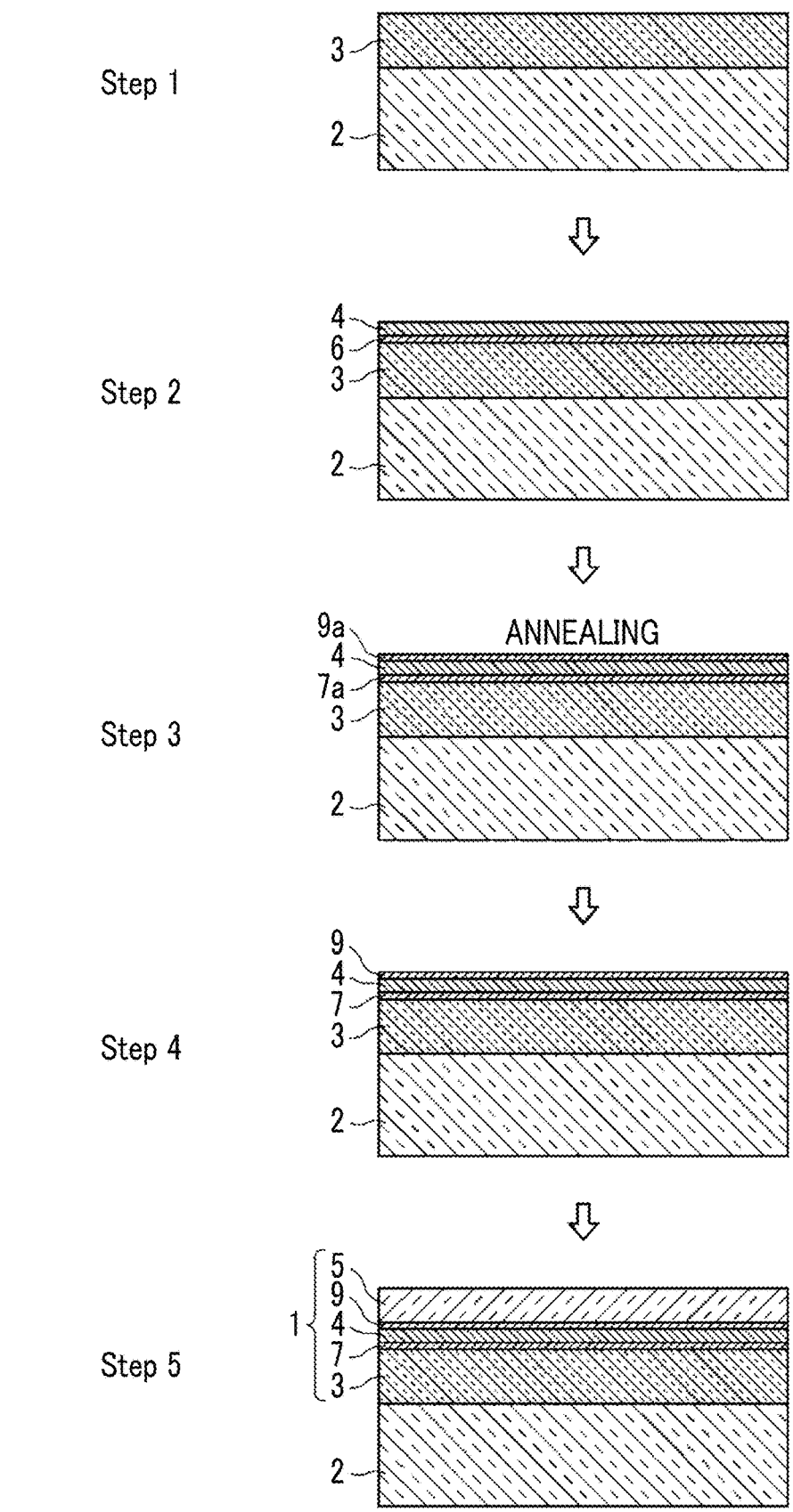
FIG. 2 is a diagram showing a production step of the antireflection film.

A method of producing an antireflection film for obtaining a structure including the anchor region and the cap region for realizing the effect of the present invention will be described. FIG. 2 is a diagram showing a production step.

The interlayer 3 is formed on the substrate 2 (Step 1), then a metal in a metal oxide included in the anchor region and the cap region is formed into a layer as the anchor layer 6, and further, the silver-containing metal layer 4 is formed (Step 2). The anchor layer 6 and the silver-containing metal layer 4 are formed in the atmosphere in which oxygen does not exist. The film thickness of the anchor layer is preferably about 0.2 nm to 2.0 nm.

Since a part of the anchor metal constituting the anchor layer is moved to the surface of the silver-containing metal layer 4 in the production process in the antireflection film as already described above, the anchor layer is altered into the anchor region and the thickness is greatly changed. The movement (diffusion) of the anchor metal starts to occur immediately after the silver-containing metal layer 4 is formed.

Thereafter, the substrate 2 in which the interlayer 3, the anchor layer 6, and the silver-containing metal layer 4 are laminated in order is exposed to the ambient air and annealing is performed in the ambient air (Step 3). The annealing temperature is preferably 100° C. to 400° C. and the annealing time is preferably about 1 minute to 2 hours. When the annealing is started, the anchor metal in the anchor layer 6 already moves through the silver-containing metal layer 4 and a precursor region 9a of the cap region is being formed on the surface of the silver-containing metal layer 4. On the other hand, the anchor layer 6 becomes a region 7a in the middle of alternation into the anchor region.

In the anchor metal which has started to move after the film formation, the anchor metal moved to the surface of the silver-containing metal layer 4 starts to be oxidized in a stage in which the substrate 2 is exposed to the ambient air. Then, the diffusion or oxidation of the anchor metal is promoted by annealing and after the annealing treatment, the anchor layer 6 is altered into the anchor region 7 and the anchor metal which has passed through the silver-containing metal layer 4 and moved to the surface of the laminate is oxidized to form a metal oxide. Thus, the cap region 9 including the metal oxide is formed (Step 4).

Thereafter, the dielectric layer 5 is formed on the cap region 9 which is the outermost surface of the laminate (Step 5).

Through the above steps, the antireflection film 1 of the embodiment shown in FIG. 1 can be prepared.

The antireflection film according to the embodiment of the present invention can be applied to the surface of various optical members. Since the antireflection film can be applied to a lens surface having a high refractive index, for example, the antireflection film is suitably used for the outermost surface of a known zoom lens described in JP2011-186417A.

An embodiment of an optical system constituted by a group lens including the antireflection film 1 of the above-described first embodiment will be described.

Figure 3:
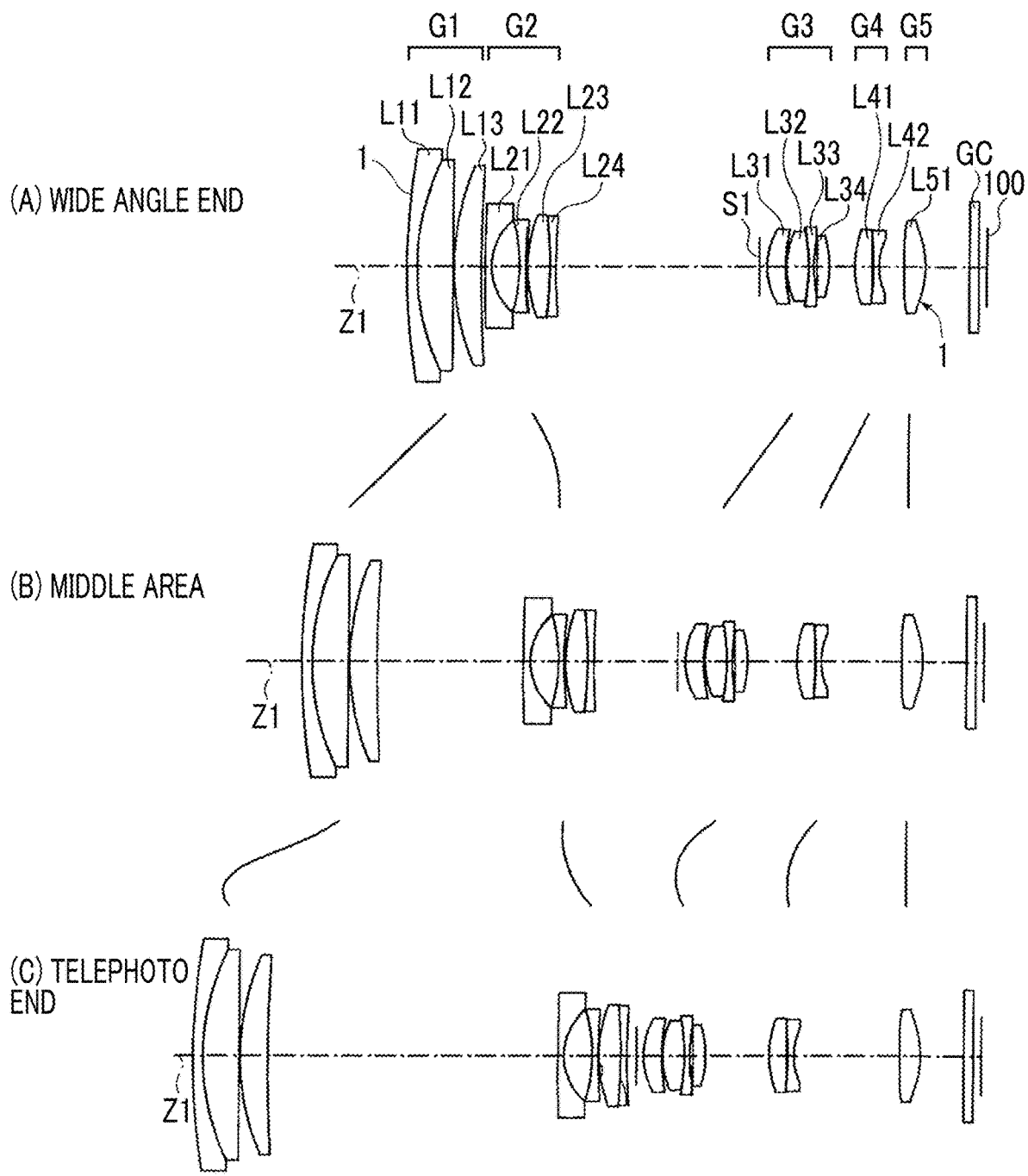
FIG. 3 is a diagram showing a configuration of an optical system consisting of a group lens including the optical element of the present invention.

(A), (B), and (C) of FIG. 3 show configuration examples of a zoom lens which is an embodiment of the optical system according to the embodiment of the present invention. (A) of FIG. 3 corresponds to an optical system arrangement at a wide angle end (shortest focal length state), (B) of FIG. 3 corresponds to an optical system arrangement in a middle area (intermediate focal length state), and (C) of FIG. 3 corresponds to an optical system arrangement at a telephoto end (longest focal length state).

The zoom lens includes a first lens group G1, a second lens group G2, a third lens group G3, a fourth lens group G4, and a fifth lens group G5 in order from an object along an optical axis Z1. An optical aperture stop S1 is preferably arranged between the second lens group G2 and the third lens group G3 in the vicinity of the third lens group G3 on the side close to the object. Each of the lens groups G1 to G5 includes one or a plurality of lenses Lij. The reference symbol Lij denotes a j-th lens with the reference symbol affixed such that a lens arranged to be closest to the object in an i-th lens group is made into the first side and the reference symbol is gradually increased toward an image forming side.

The zoom lens can be mounted in an information portable terminal as well as imaging devices, for example, a video camera, and a digital camera. On the imaging side of the zoom lens, members are arranged according to the configuration of an imaging portion of a camera in which the lens is to be mounted. For example, an imaging element 100 such as a charge coupled device (CCD) or a complementary metal oxide semiconductor (CMOS) is arranged on an image forming surface (imaging surface) of the zoom lens. Various optical members GC may be arranged between the final lens group (fifth lens group G5) and the imaging element 100 according to the configuration of the camera side in which the lens is mounted.

The zoom lens is configured such that the magnification is changed by chaining the gaps between the individual groups by moving at least the first lens group G1, the third lens group G3, and the fourth lens group G4 along the optical axis Z1. In addition, the fourth lens group G4 may be moved at focusing. It is preferable that the fifth lens group G5 is always fixed in magnification change and at focusing. The aperture stop S1 is moved together with the third lens group G3, for example. More specifically, as the magnification changes from the wide angle end to the middle area and further to the telephoto end, each lens group and the aperture stop S1 is moved, for example, from the state of (A) of FIG. 3 to the state of (B) of FIG. 3 and further to the state of (C) of FIG. 3 along the locus indicated the solid line in the drawing.

The antireflection film 1 is provided on the outermost surfaces of the zoom lens of the outer surface (the surface close to the object) of a lens L11 of the first lens group G1 and a lens L51 of the fifth lens group G5 which is the final lens group. The antireflection film 1 may be provided other lens surfaces in the same manner.

Since the antireflection film 1 of the embodiment has high mechanical strength, the antireflection film can be provided on the outermost surface of the zoom lens which may be touched by a user and thus a zoom lens having very high antireflection performance can be formed.

In addition, in the antireflection film having a fine uneven structure, fluctuations in the refractive index are present in addition to the uneven structure and thus there is a concern of scattering occurring due to the fluctuations in the refractive index. However, since almost no fluctuations the in refractive index are present in the antireflection film according to the embodiment of the present invention having an uneven structure, scattering hardly occurs. In the antireflection film in a camera lens, scattering causes the occurrence of flare and thus a contrast in an image is lowered. Thus, scattering is suppressed by providing the antireflection film according to the embodiment of the present invention, and as a result, it is possible to prevent a contrast in an image from being lowered.

EXAMPLES

Hereinafter, a structure of main portions of the present invention will be described using specific examples.

First, samples of Examples and Comparative Examples in which an anchor region, a silver-containing metal layer, and a cap region were provided on a glass substrate were prepared. The results of evaluation of the transparency and the smoothness of the silver-containing metal layer thereof will be described.

<Method of Preparing Sample>

An anchor layer formed of an anchor metal shown in Table 2 was formed on a glass substrate ($SiO_2$ substrate). The film was formed under the following conditions using a sputtering apparatus (CFS-8EP) manufactured by Shibaura Mechatronics Co., Ltd.

Direct current (DC) input power=20 W

Ar: 20 sccm, Depo pressure (film formation pressure): 0.45 Pa

Film formation temperature: room temperature

A silver-containing metal layer was formed without exposure to the ambient air subsequently after the anchor layer was formed. Here, a silver film was formed as the silver-containing metal layer. The film formation conditions are as follows.

DC input power=80 W

Ar: 15 sccm, Depo pressure: 0.27 Pa

Film formation temperature: room temperature

The anchor layer was formed at a thickness of 0.68 nm and the silver film was formed at a thickness of 4 nm (the film thickness herein is a design film thickness). The design film thickness at the time of film formation means a film thickness formed by obtaining the time required for forming the design film thickness from the sputtering time in a case where 20 nm films were respectively formed on the glass substrate under the same film formation conditions and performing film formation during that time.

Thereafter, the samples of each of Examples and Comparative Examples were respectively annealed at the annealing temperature and in the atmosphere shown in Table 2. The "Air" in Table 2 means that annealing is performed in the ambient air and "Vac" means that annealing is performed in vacuum without exposure to the ambient air.

The samples of Examples and Comparative Examples obtained as described above were subjected to the following measurements.

<Ratio Between Metal Region and Metal Oxide Region in Anchor Region>

Evaluation was performed by X-ray photoelectron spectroscopy (XPS). As the measurement device, Quantera SXM manufactured by ULVAC-PHI, Inc. was used.

Figure 4:
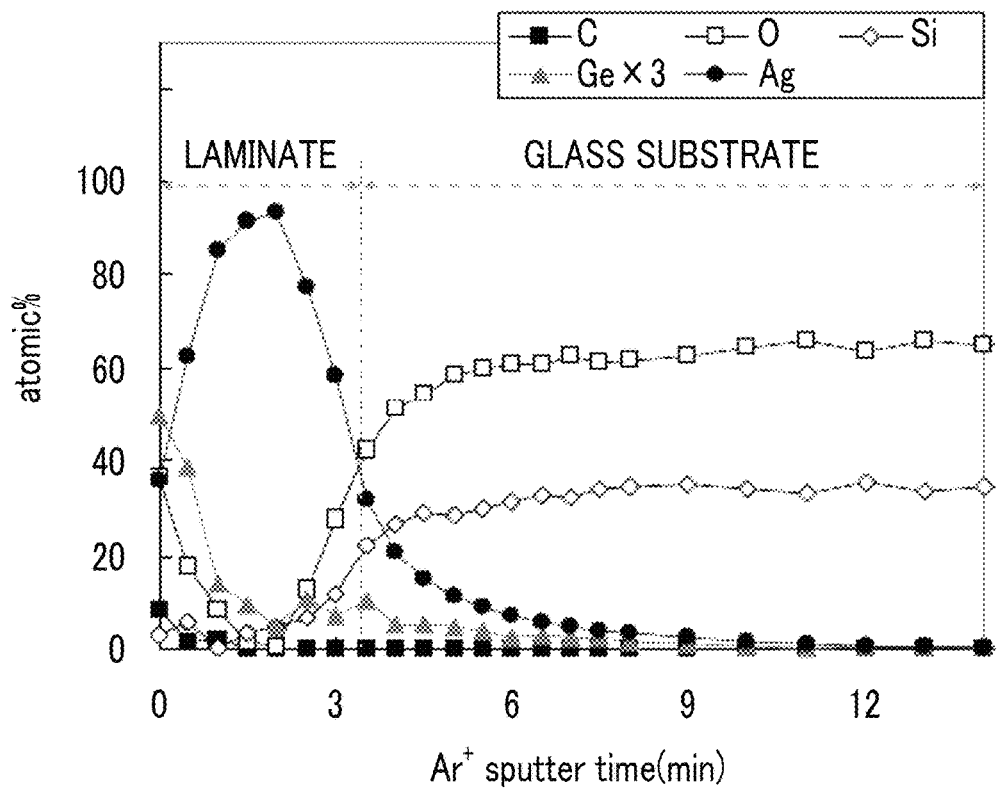
FIG. 4 is a diagram showing an element distribution of a sample in Example 1 in a depth direction before annealing.
Figure 5:
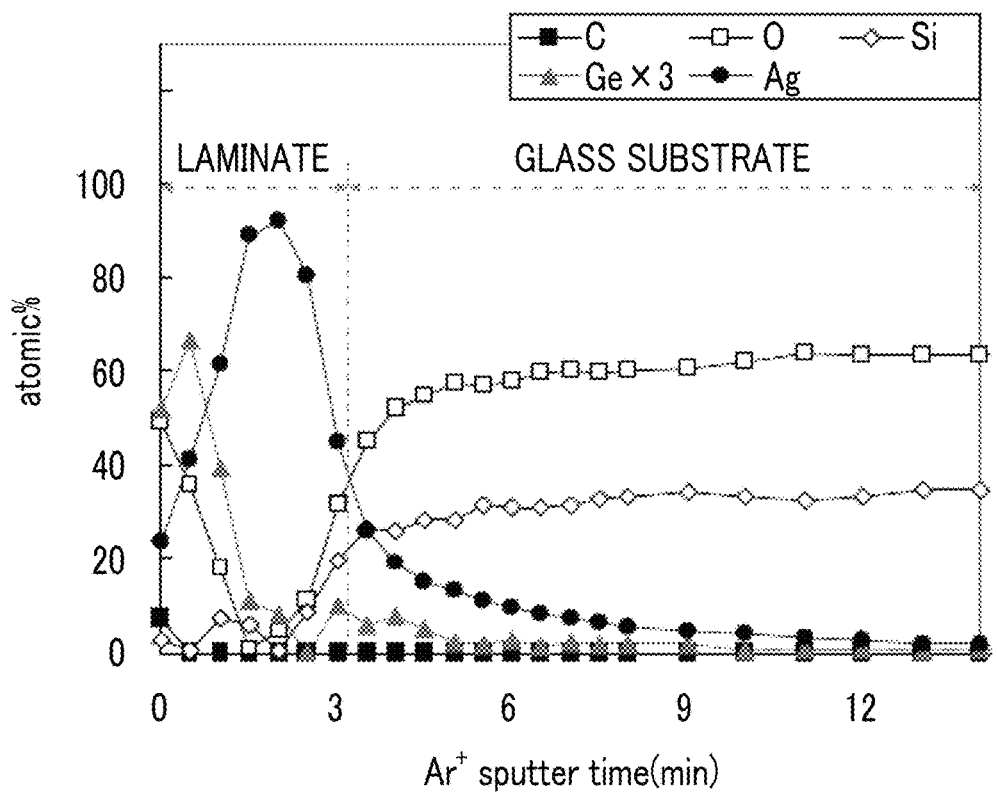
FIG. 5 is a diagram showing an element distribution of the sample in Example 1 in the depth direction after annealing.
Figure 6:
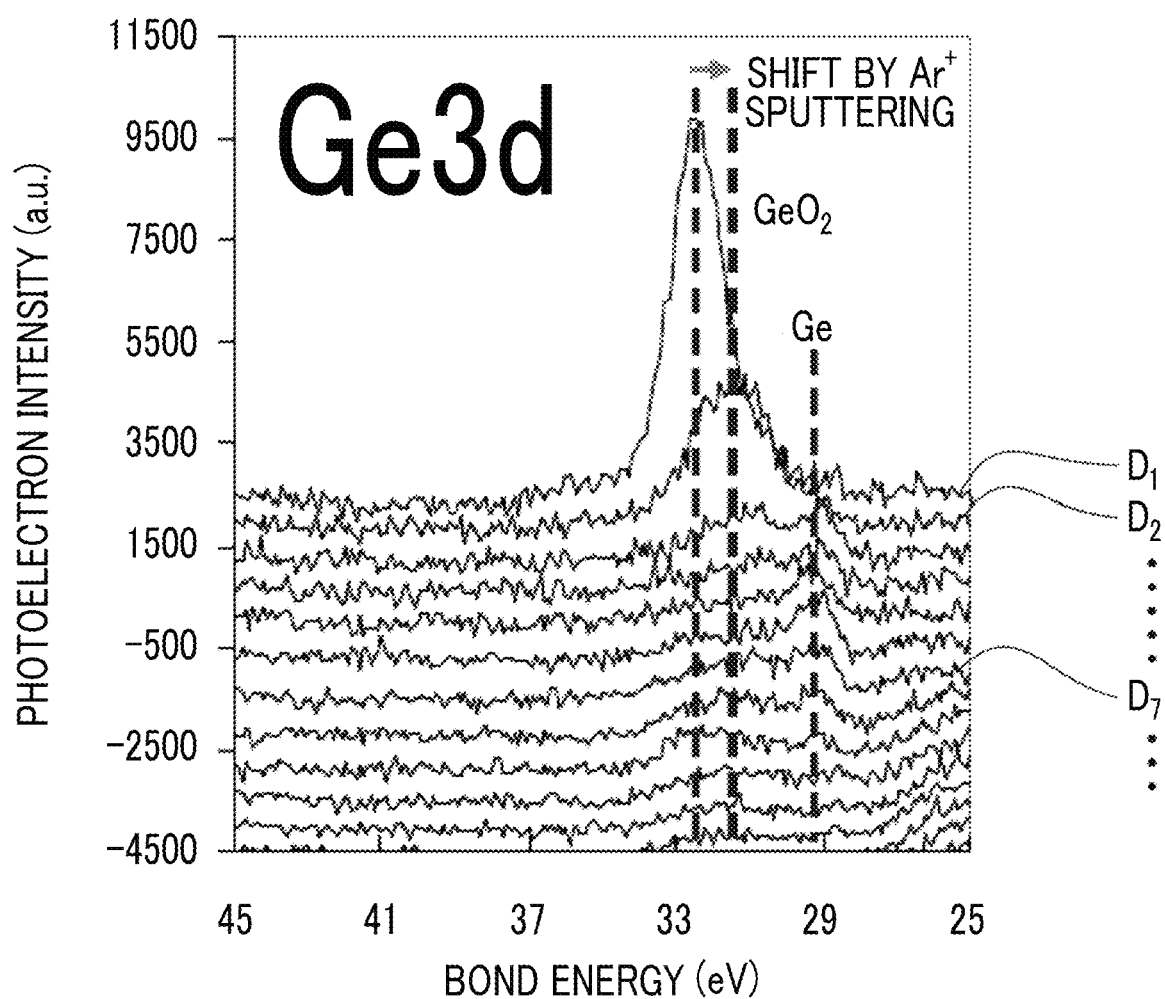
FIG. 6 is a diagram showing a Ge3d spectrum of the sample in Example 1 in the depth direction before annealing.
Figure 7:
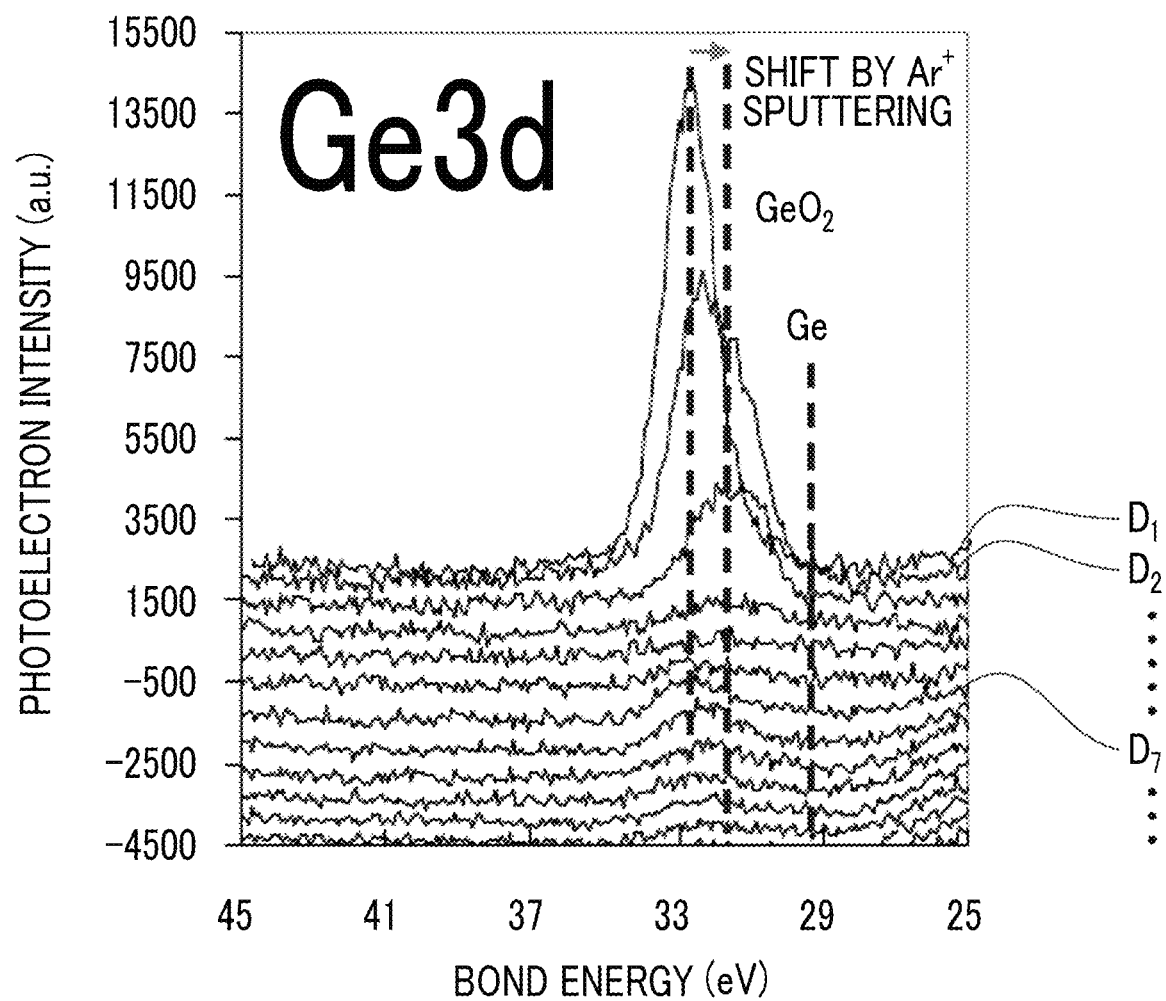
FIG. 7 is a diagram showing a Ge3d spectrum of the sample in Example 1 in the depth direction after annealing.

FIGS. 4 and 5 are graphs showing element distributions of the sample in Example 1 in an element distribution depth direction in a depth direction from the surface of the laminate to the glass substrate before annealing and after annealing, which are obtained by XPS. In FIGS. 4 and 5, the horizontal axis 0 is the position of the surface of the laminate, and in order to make the distribution of Ge easier to see, Ge is shown at a magnification of 3 times. Therefore, the actual content of Ge is ⅓ of the value on the vertical axis of the graph. FIGS. 6 and 7 show Ge3d spectra (Dn:n=1, 2, 3 . . . ) of the sample in Example 1 obtained by XPS and obtained at each position in the depth direction by drilling by Ar$^+$ sputtering in the depth direction from the surface of the laminate to the substrate before annealing and after annealing at the same time. In the drawings, data $D_1$ is the data on the laminate surface position, and as n becomes larger, the data indicates the position closer to the substrate drilled by Ar$^+$ sputtering in a direction perpendicular to the surface. In FIGS. 6 and 7, regarding the peak of GeO$_2$ on the surface is slightly shifted to the low bond energy side due to the effect of Ar$^+$ sputtering. The data acquisition interval in the horizontal axis (sputtering time) in FIGS. 4 and 5 the data acquisition interval from the surface to the substrate in FIGS. 6 and 7 correspond to each other.

By comparing FIG. 6 with FIG. 7, it is found that the peak of GeO$_2$ on the surface becomes large after annealing, while the peak of Ge present before annealing is not present after annealing. In addition, in the inside in the depth direction, before annealing, the peak intensity of Ge is higher than the peak intensity of GeO$_2$, but after annealing, inversely, the peak intensity of GeO$_2$ is higher than the peak intensity of Ge. At least from FIG. 7, it is possible to determine that the content of GeO$_2$ is larger than the content of Ge in the anchor region of the sample in Example 1 (after annealing). Specifically, it is considered that the seventh and eighth data from the surface in FIG. 7 corresponds to the anchor region.

<Evaluation of Presence of Oxide Layer in Cap Region>

The presence of the oxide of the anchor metal in the cap region measured by XPS and a transmission electron microscope (TEM) was evaluated by energy dispersive X-ray spectrometry (EDX) (FIGS. 6 and 7).

Figure 8:
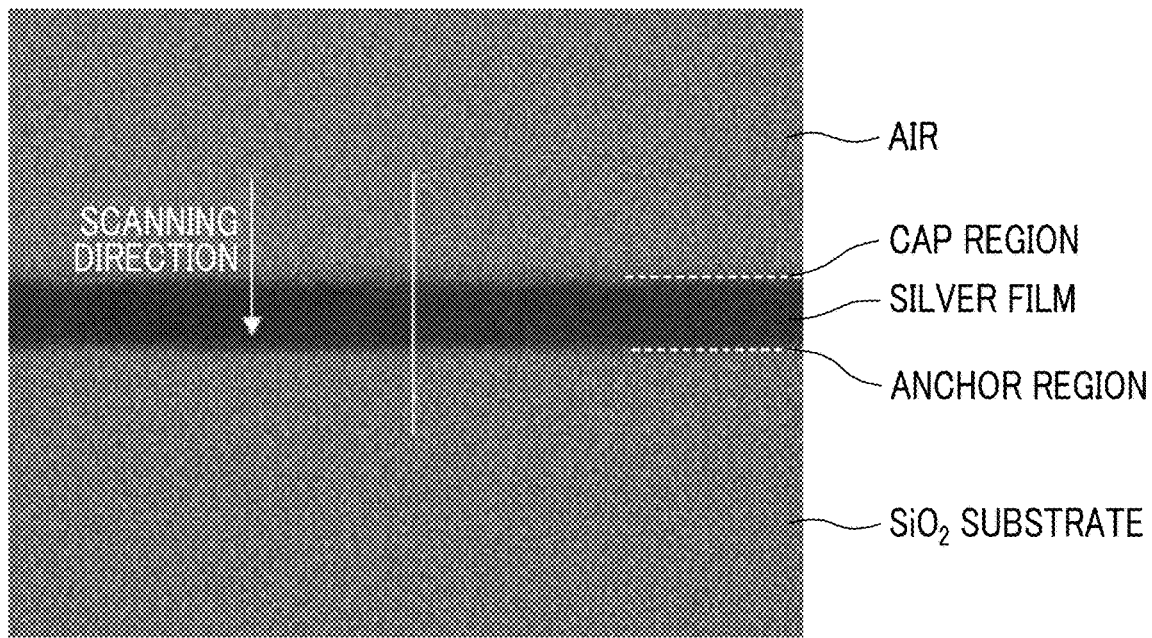
FIG. 8 is a scanning transmission electron microscope image of the sample in Example 1.
Figure 9:
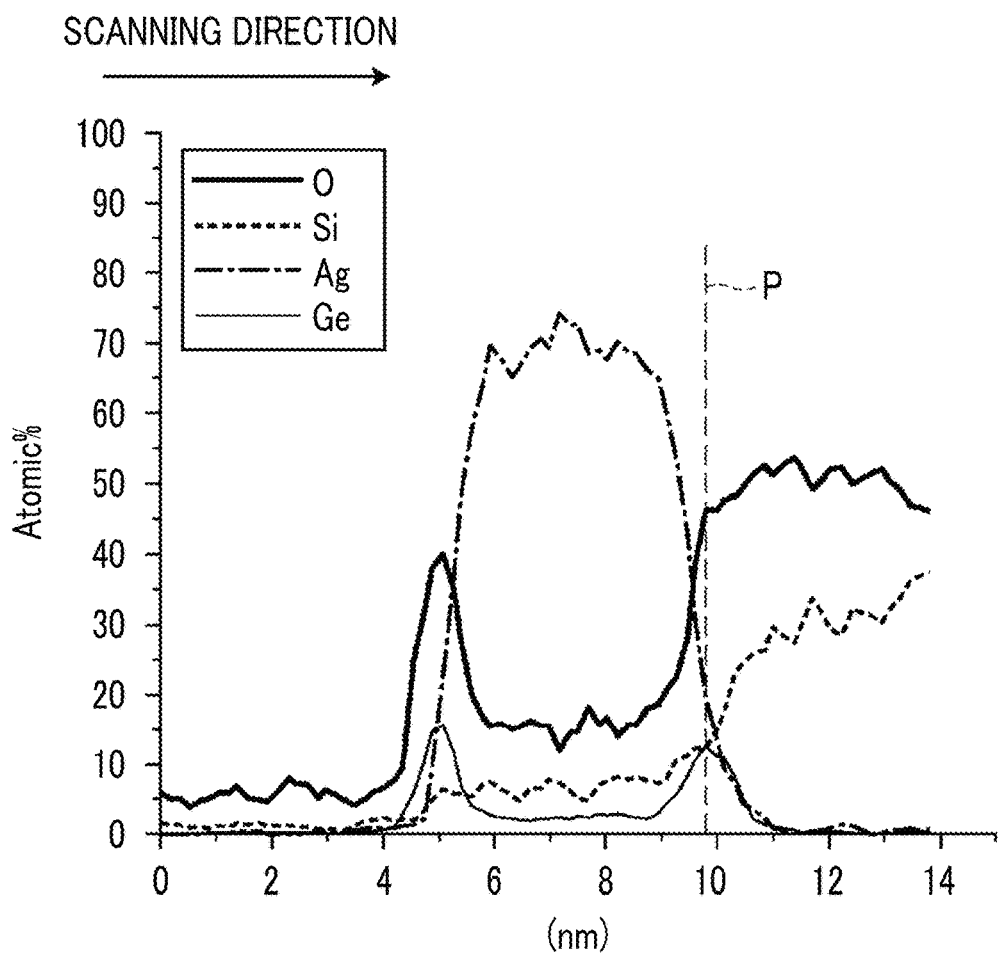
FIG. 9 is a diagram showing an element distribution of the sample in Example 1 in the depth direction by energy dispersive X-ray spectrometry.

FIG. 8 is a bright-field-scanning transmission electron microscope image (Bright-field-STEM image) of the sample in Example 1, and an EDX analysis portion is the region shown by the white line near the center in FIG. 8. FIG. 9 is a graph showing the distribution of the element to be analyzed in the depth direction according to the EDX analysis result. As a transmission electron microscope, HD-2700 manufactured by Hitachi High-Technologies Corporation was used.

As described above, the presence of GeO$_2$ in the anchor region in Example 1 was confirmed from FIG. 7. On the other hand, the compositional ratio at each position in the depth direction is clear from the distribution of each element in the depth direction shown in FIG. 9, and from the compositional ratio, it is possible to calculate the existence probability of GeO$_2$ and Ge.

In FIG. 9, the anchor region is near at the position of 9.8 nm (indicated by P in FIG. 9) where the horizontal axis Ge is a peak. Since the anchor region is a region adjacent to the substrate, Si is bled out. At this peak position, the compositional ratio of Ge, Si, and O is Ge (12%), Si (12%), and O (48%) and thus it is found that oxygen is present in the forms of SiO$_2$ and GeO$_2$.

Regarding Examples 1, 2, and 5, the magnitude of the content ratio of the oxide and the unoxidized anchor metal in the anchor region and the presence of the oxide of the anchor metal in the cap layer were confirmed.

<Evaluation of Transparency>

The absorbance of light having a wavelength of 550 nm was measured with a spectrophotometer. As the absorbance becomes lower, the permeability becomes higher. As long as the absorbance is approximately 10% or less, the film is a practically acceptable level. Specifically, measurement was performed at a scan speed of 600 nm/min in a range of 300 nm to 1200 nm using HITACHI U-4000, and the measured value at a wavelength of 550 nm was extracted.

<Evaluation of Flatness>

The crystal grain size of the silver particle in the silver film was calculated by X-ray diffraction (XRD) measurement. For evaluating the crystallinity of the very thin film, specifically, grazing incidence X-ray diffraction (GIXRD) which is measurement for a thin film with the incidence angle fixed near the critical angle was used. An X-ray diffraction chart was obtained by GIXRD and the crystal grain size was calculated using the Scherrer equation from the half-width of the (111) plane peak of silver near a diffraction angle 2θ=38° generated in the X-ray diffraction chart. The smaller the crystal grain size of the silver particle is, the more preferable it is. However, the crystal grain size is practically preferably 6 nm or less. The area of the X-ray irradiation region by GIXRD is 1 cm×1 cm and the particle size calculated based on the Scherrer equation is the average value of the X-ray irradiation region.

<Film Thickness Measurement>

The film thickness was calculated by measurement of X-ray reflectivity (XRR). The film thickness herein includes the cap region, the silver film, and the anchor region.

In all of Examples and Comparative Examples, as already described above, film formation is performed such that the design film thickness of the silver film is 4 nm and the design film thickness of the anchor layer is 0.68 nm. However, the film thickness of the silver film after sample preparation changes depending on preparation conditions such as the kind of metal of the anchor layer, and annealing temperature. By fitting the vibration component of XRR signal of the obtained film (sample), the film thickness including the silver film, the anchor region, and the cap region was calculated. As already described above, considering that the anchor region and the cap region are very thin and have a thickness of about 1 nm or less and the anchor metal is diffused over the whole area of the silver film and the interface region with SiO$_2$, the film is considered to be constituted of the SiO$_2$ substrate and the silver film and fitting is performed.

Table 2 collectively shows preparation conditions and measurement (evaluation) results of the samples of Examples 1 to 6 and Comparative Examples 1 to 4 prepared and evaluated by the above methods.

TABLE 2

| | Preparation Conditions | | | Measurement (evaluation) results | | | |
|---|---|---|---|---|---|---|---|
| | Anchor metal | Annealing temperature | Atmosphere | Film thickness by XRR measurement | Anchor region | Absorbance @ 550 nm | Particle size by XRD |
| Example 1 | Ge | 300° C. | Air | 4.86 nm | $GeO_2$ > Ge | 3.40% | 3.9 nm |
| Example 2 | Sn | 300° C. | Air | 4.92 nm | $SnO_2$ > Sn | 8.30% | 4.8 nm |
| Example 3 | Zn | 300° C. | Air | 5.12 nm | — | 9.23% | 5.3 nm |
| Example 4 | Ge | 100° C. | Air | 4.86 nm | $GeO_2$ < Ge | 8.20% | 4.1 nm |
| Example 5 | In | 300° C. | Air | 4.93 nm | — | 7.56% | 3.8 nm |
| Example 6 | Ga | 300° C. | Air | 4.88 nm | — | 9.87% | 4.3 nm |
| Comparative Example 1 | Ge | 300° C. | Vac | 4.95 nm | Ge > $GeO_2$ | 11.20% | 13.2 nm |
| Comparative Example 2 | Cr | 300° C. | Air | 5.04 nm | — | >20% | 11.2 nm |
| Comparative Example 3 | mo | 300° C. | Air | 5.32 nm | — | >20% | 12.3 nm |
| Comparative Example 4 | Al | 300° C. | Air | 4.75 nm | — | — | 6.8 nm |

In Table 2, the part indicated by "-" indicates that the evaluation is not performed.

As shown in Table 2, in Examples 1 to 6 in which the anchor metal satisfying the conditions of the present invention was used and annealing was performed in an oxygen-containing atmosphere, as compared with Comparative Examples, it is found that the particle size of the silver particles is suppressed and the smoothness is high. Further, in Examples 1, 2, and 4 in which the transparency was evaluated at the same time, the absorbance was lower than those of Comparative Examples. It is found from the absorbances of Examples 1 and 5 that as the ratio of the oxide in the anchor region increases, the absorbance decreases. It is considered that the oxidation of the anchor metal is promoted by adjusting the annealing temperature and time, so that the transparency can be improved. On the other hand, it is considered that while the same anchor metal as in Example 1 was used in Comparative Example 1, annealing was performed in an environment where oxygen does not exist, and thus, the transparency could not be sufficiently improved. Further, it is considered that since the oxidization of the anchor metal in the cap region was not sufficient, aggregation of silver occurred at the time of annealing and the particle size of silver was increased. That is, it is considered that the anchor metal in the cap region has to be sufficiently oxidized to form an oxide in order to attain sufficient smoothness of the silver film.

In the antireflection film according to the embodiment of the present invention, examples of the specific layer structure contributing to antireflection performance will be described. The followings are simulation results of the film thickness obtained by optimizing the film thickness using Essential Macleod (manufactured by Thin Film Center Inc.) and the wavelength dependence of the reflectance.

Example 7

A layer structure from a substrate to air as a medium was set as shown in Table 3.

Assuming FDS90 (manufactured by HOYA Corporation) as the substrate, the refractive index was set to 1.86814. Each interlayer respectively adopted a four-layer structure (Example 7-1) in which a $SiO_2$ layer having a refractive index of 1.46235 as a layer of low refractive index and a $Nb_2O_5$ layer having a refractive index of 2.3955 as a layer of high refractive index were alternately laminated, a five-layer structure (Example 7-2), a six-layer structure (Example 7-3), a seven-layer structure (Example 7-4), an eight-layer structure (Example 7-5), a twelve-layer structure (Example 7-6), and a sixteen-layer structure (Example 7-7), the silver-containing metal layer was formed of Ag, and the dielectric layer was formed of $MgF_2$. Then, the film thickness of each example was optimized so as to minimize the reflectance.

TABLE 3

| | | | Example 7 | | | | | | |
|---|---|---|---|---|---|---|---|---|---|
| Layer | Constituent material | Refractive index | Example 7-1 Physical film thickness (nm) | Example 7-2 Physical film thickness (nm) | Example 7-3 Physical film thickness (nm) | Example 7-4 Physical film thickness (nm) | Example 7-5 Physical film thickness (nm) | Example 7-6 Physical film thickness (nm) | Example 7-7 Physical film thickness (nm) |
| Medium | Air | 1 | — | — | — | — | — | — | — |
| Dielectric layer | $MgF_2$ | 1.3857 | 92.94 | 92.79 | 91.07 | 91 | 90.54 | 90.58 | 89.55 |
| Metal layer | Ag | 0.05 | 3.07 | 3.2 | 4.01 | 4.19 | 4.16 | 4.32 | 4.53 |
| Interlayer 1 | $Nb_2O_5$ | 2.3955 | 22 | 22.11 | 18.88 | 18.4 | 17.52 | 17.56 | 16.34 |
| Interlayer 2 | $SiO_2$ | 1.46235 | 47.22 | 48.98 | 73.06 | 83.53 | 82.92 | 94.22 | 118.14 |
| Interlayer 3 | $Nb_2O_5$ | 2.3955 | 17.85 | 18.46 | 9.78 | 8.03 | 6 | 5.96 | 5.35 |
| Interlayer 4 | $SiO_2$ | 1.46235 | 25.5 | 35.63 | 65.78 | 72.05 | 71.83 | 74.88 | 63.99 |

TABLE 3-continued

Example 7

| Layer | Constituent material | Refractive index | Example 7-1 Physical film thickness (nm) | Example 7-2 Physical film thickness (nm) | Example 7-3 Physical film thickness (nm) | Example 7-4 Physical film thickness (nm) | Example 7-5 Physical film thickness (nm) | Example 7-6 Physical film thickness (nm) | Example 7-7 Physical film thickness (nm) |
|---|---|---|---|---|---|---|---|---|---|
| Interlayer 5 | Nb$_2$O$_5$ | 2.3955 | — | 5.62 | 13.57 | 16.63 | 10.53 | 16.3 | 20.98 |
| Interlayer 6 | SiO$_2$ | 1.46235 | — | — | 22.38 | 35.32 | 28.46 | 30.24 | 31.57 |
| Interlayer 7 | Nb$_2$O$_5$ | 2.3955 | — | — | — | 8.39 | 8.61 | 4.72 | 9.43 |
| Interlayer 8 | SiO$_2$ | 1.46235 | — | — | — | — | 11.54 | 10.33 | 9.66 |
| Interlayer 9 | Nb$_2$O$_5$ | 2.3955 | — | — | — | — | — | 12.53 | 19.42 |
| Interlayer 10 | SiO$_2$ | 1.46235 | — | — | — | — | — | 15.66 | 20.41 |
| Interlayer 11 | Nb$_2$O$_5$ | 2.3955 | — | — | — | — | — | 7.54 | 8.54 |
| Interlayer 12 | SiO$_2$ | 1.46235 | — | — | — | — | — | 4.51 | 9.3 |
| Interlayer 13 | Nb$_2$O$_5$ | 2.3955 | — | — | — | — | — | — | 9.67 |
| Interlayer 14 | SiO$_2$ | 1.46235 | — | — | — | — | — | — | 14.14 |
| Interlayer 15 | Nb$_2$O$_5$ | 2.3955 | — | — | — | — | — | — | 9.47 |
| Interlayer 16 | SiO$_2$ | 1.46235 | — | — | — | — | — | — | 5.69 |
| Substrate | FDS90 | 1.86814 | — | — | — | — | — | — | — |

Figure 10:
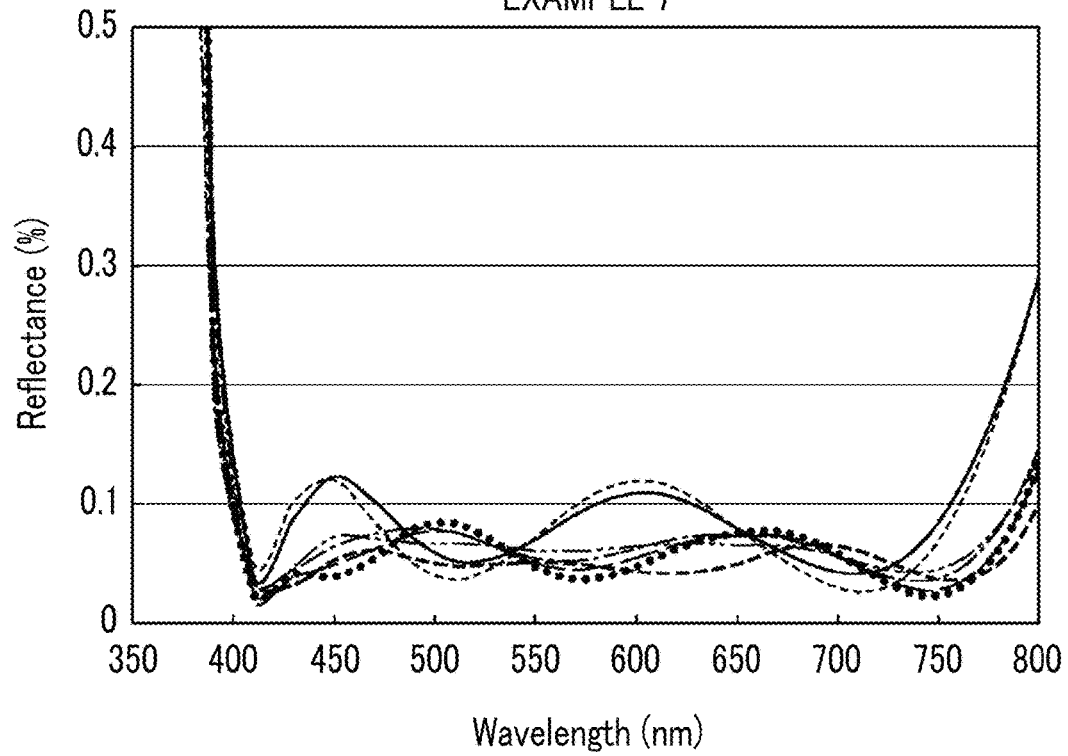
FIG. 10 is a diagram showing wavelength dependence of the reflectance of an antireflection film in Example 7.

The simulation results of the reflectance of each antireflection film of Example 7 with respect to light incident at a light incidence angle of 0° (light vertically incident to the surface) are shown in FIG. 10. The numbers in the parentheses after each example shown in the explanatory note refer to the total number of interlayers. As shown in FIG. 10, the antireflection films of Examples 7-1 and 7-2 exhibited a reflectance of 0.2% or less over a wide wavelength range of 400 nm to 780 nm, and the antireflection films of Examples 7-3, 7-4, 7-5, 7-6, and 7-7 exhibited a reflectance of 0.2% or less over a wider wavelength range of 400 nm to 800 nm and exhibited a reflectance of 0.1% or less in a wavelength range of 400 nm to 780 nm. Very satisfactory antireflection properties were obtained.

Preparation Examples of Silver-Containing Metal Film

In a case where each antireflection film of Example 7 obtained in the above-described simulation was actually prepared, as already described above, antireflection properties change greatly depending on the formation accuracy of the metal film particularly including Ag. The cause of the deviation from the simulation will be described in detail below.

Preparation Example 1

A film formed of pure silver was formed at a thickness of 5 nm on the substrate by an electron beam vapor deposition method using EVD-1501 manufactured by Canon Anelva Corporation and the reflection spectrum of the film formed of pure silver (silver film) was measured by using a reflection film thickness spectrometer FE3000 manufactured by Otsuka Electronics Co., Ltd.

Preparation Example 2

A silver alloy film was formed was formed at a thickness of 5 nm on the substrate by a sputtering method using GD02 (manufactured by KOBELCO research institute), which is a silver alloy target (Ag—0.7% Nd—0.9% Cu: hereinafter, referred to as ANC), as a target, and the reflection spectrum of the film was measured by using a reflection film thickness spectrometer FE3000 manufactured by Otsuka Electronics Co., Ltd.

Figure 11:
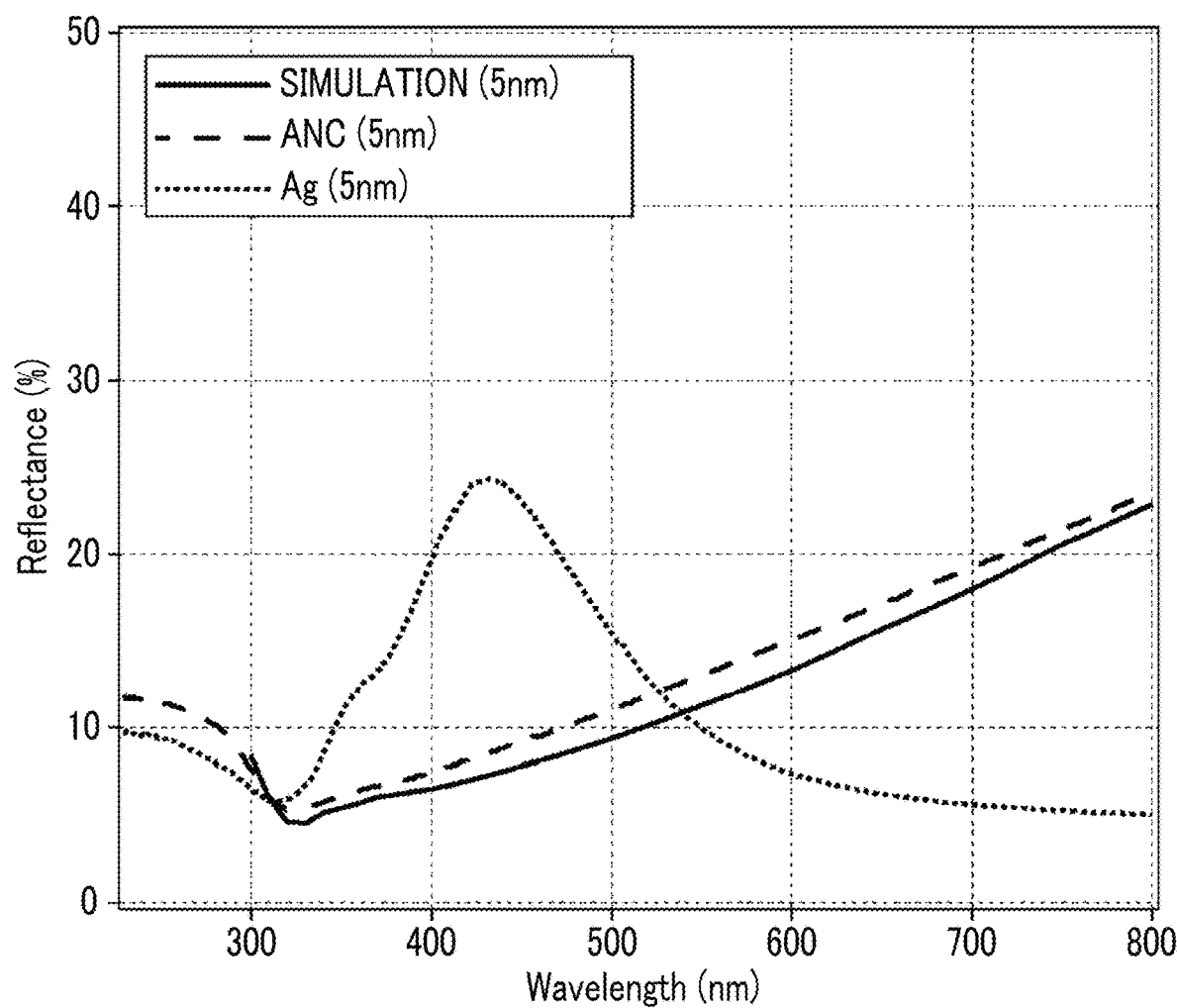
FIG. 11 is a diagram showing the reflection spectra of a silver film in Preparation Example 1 and a silver alloy film in Preparation Example 2 and the reflection spectrum of a silver film obtained by simulation.

FIG. 11 shows the reflection spectra of the silver film (Ag) in Preparation Example 1 and the silver alloy film (ANC) in Preparation Example 2 together with a calculated value (simulation) of a pure silver film of a thickness of 5 nm.

As shown in FIG. 11, the reflection spectrum of the film of Preparation Example 1 greatly deviated from the calculated value of a pure silver film of a thickness of 5 nm while the reflection spectrum of the film in Preparation Example 2 was consistent with the calculated value with a very high accuracy. Since the contents of metals other than silver in the ANC are small, the contribution to reflectance by components other than silver can be neglected.

The surface of each film in Preparation Examples 1 and 2 was evaluated using a scanning electron microscope (SEM) and an atomic force microscope (AFM).

Figure 12:
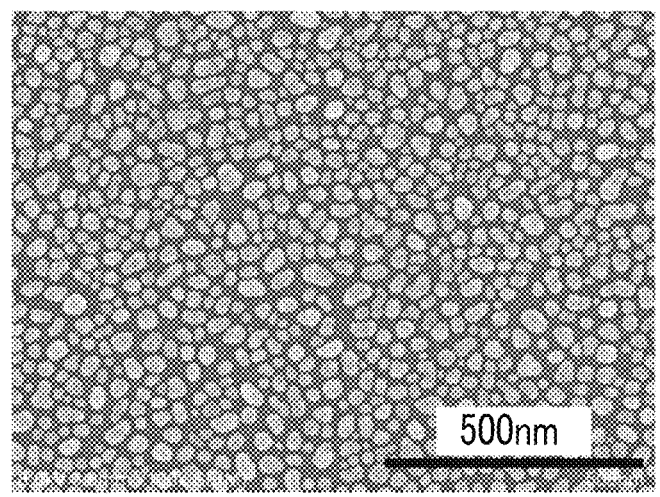
FIG. 12 is a scanning electron microscope image of the silver film in Preparation Example 1.
Figure 13:
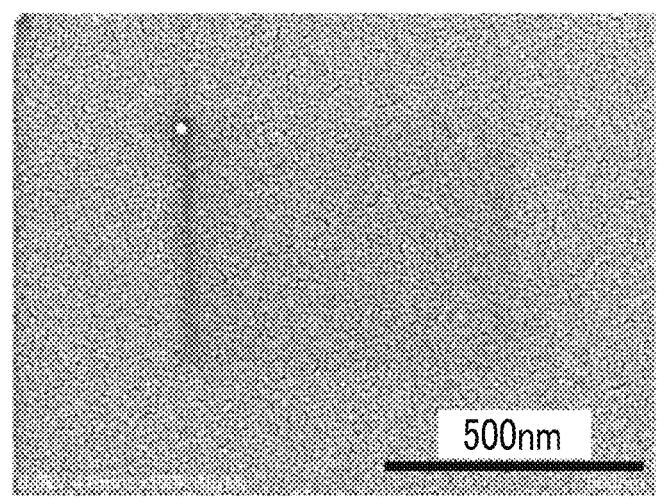
FIG. 13 is a scanning electron microscope image of the silver alloy film in Preparation Example 2.

FIG. 12 is an SEM image of Preparation Example 1 (Ag) and FIG. 13 is an SEM image of Preparation Example 2 (ANC).

As shown in FIG. 12, the silver film in Preparation Example 1 does not have uniform film thickness and grows into a granular form. Since the silver grows into a granular form in this manner, it is considered that plasmon resonance occurs due to the incidence ray, resulting in a reflection spectrum whose reflectance is significantly different from the calculated value. On the other hand, as shown in FIG. 13, an ANC alloy film having a very small particle size and high flatness compared to the silver film in Preparation Example 1 is obtained.

FIGS. 11 to 13 shows that as the silver-containing metal layer, as in Preparation Example 2, in a case of using a film having a smaller particle size and higher smoothness, an antireflection film having properties closer to the wavelength dependence of the reflectance obtained in the simulation can be obtained. The particle size in the silver film in Preparation Example 1 shown in FIG. 12 is about 15 to 20 nm, but the particle size of the ANC alloy film in Preparation Example 2 shown in FIG. 13 is 6.3 nm. Since the anchor layer is not introduced into the film shown in FIG. 13, the flatness is improved but is not sufficient.

That is, it is considered that by applying the silver film having high flatness as in the samples in Examples 1 to 6 described above to the layer structure of the antireflection film in Example 7, an antireflection film having properties closer to the wavelength dependence of the reflectance obtained in the simulation can be obtained. Since the anchor region and the cap region are very thin and have a thickness of about 1 nm, the regions hardly contribute to the antireflection function and the reflectance of the simulation shown in Example 7 above is hardly changed.

EXPLANATION OF REFERENCES 1 antireflection film
2: substrate
3: interlayer
4: silver-containing metal layer
5: dielectric layer
6: anchor layer
7: anchor region
7a: region in the middle of alternation into anchor region
9: cap region
9a: precursor region of cap region
10: optical element
11: layer of high refractive index
12: layer of low refractive index
100: imaging element
G1 to G5: lens group
GC: optical member
L11 to L51: lens
S1: aperture stop
Z1: optical axis

What is claimed is:

1. An antireflection film that is provided on a substrate and is formed by laminating an interlayer, a silver-containing metal layer containing silver, and a dielectric layer in this order from the substrate, comprising:
    an anchor region including an oxide of an anchor metal provided between the silver-containing metal layer and the interlayer; and
    a cap region including an oxide of the anchor metal provided between the silver-containing metal layer and the dielectric layer,
    wherein a crystal grain size obtained by X-ray diffraction measurement in the silver-containing metal layer is less than 6.8 nm, and
    the anchor metal is Ge.

2. The antireflection film according to claim 1,
    wherein a total film thickness including the anchor region, the silver-containing metal layer, and the cap region is 10 nm or less.

3. The antireflection film according to claim 1,
    wherein the anchor region includes the anchor metal which is not oxidized, and a content ratio of the oxide of the anchor metal is larger than a content ratio of the anchor metal which is not oxidized.

4. The antireflection film according to claim 1,
    wherein the surface energy of the anchor metal is 500 mN/m or more and 900 mN/m or less.

5. An optical element comprising:
    the antireflection film according to claim 1.

* * * * *